US012767415B2

(12) United States Patent
Fuller et al.

(10) Patent No.: US 12,767,415 B2
(45) Date of Patent: Oct. 20, 2026

(54) WAFER CONTAINER AND PURGE SYSTEM

(71) Applicant: ENTEGRIS, INC., Billerica, MA (US)

(72) Inventors: Matthew A. Fuller, Colorado Springs, CO (US); Colton J. Harr, Monument, CO (US); Gary Gallagher, Austin, TX (US); Peter D. Doenges, Chaska, MN (US); Thomas H. Wilkie, Colorado Springs, CO (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 17/835,716

(22) Filed: Jun. 8, 2022

(65) Prior Publication Data

US 2022/0388751 A1 Dec. 8, 2022

Related U.S. Application Data

(60) Provisional application No. 63/208,180, filed on Jun. 8, 2021.

(51) Int. Cl.
*B65D 81/26* (2006.01)
*H10P 72/10* (2026.01)

(52) U.S. Cl.
CPC .......... *B65D 81/26* (2013.01); *H10P 72/1926* (2026.01); *H10P 72/14* (2026.01)

(58) Field of Classification Search
CPC .............. B65D 81/26; H01L 21/67393; H01L 21/6732; H01L 21/6735; H01L 21/67389
See application file for complete search history.

(56) References Cited

U.S. PATENT DOCUMENTS

| | | | | |
|---|---|---|---|---|
| 2020/0020549 A1* | 1/2020 | Ogawa | F16K 15/026 |
| 2021/0118713 A1 | 4/2021 | Matsutori | |
| 2021/0257240 A1* | 8/2021 | Woo | H01L 21/67383 |

FOREIGN PATENT DOCUMENTS

| | | | | |
|---|---|---|---|---|
| JP | 2003168728 A | 6/2003 | |
| JP | 2012114133 A | 6/2012 | |
| JP | 2015074273 * | 8/2015 | |
| JP | 2016015421 A | 1/2016 | |
| JP | 2016086161 A | 5/2016 | |
| JP | 2016119327 A | 6/2016 | |
| JP | 2017017264 A | 1/2017 | |
| JP | 2018527752 A | 9/2018 | |
| WO | WO-2015194255 A1 * | 12/2015 | H01L 21/02046 |
| WO | 2016013536 A1 | 1/2016 | |
| WO | 2016035675 A1 | 3/2016 | |
| WO | 2018203524 A1 | 11/2018 | |

* cited by examiner

*Primary Examiner* — Anthony D Stashick
*Assistant Examiner* — Raven Collins

(57) ABSTRACT

In a wafer container, diffusers are positioned such that they are closer to a center line of the wafer container. This improves the distribution of purge gas within the wafer container. The diffusers can be positioned such that their position corresponds to a recessed central panel of the back wall. The diffusers can be positioned such that an angle between the diffusers relative to a center of a wafer contained within the wafer container is 60 degrees or less. The diffusers can be joined to purge ports by offset connectors oriented such that the diffusers are closer to the center line of the wafer container than the purge ports. The distance from each of the diffusers to the center line of the wafer container can be less than one fourth of a diameter of the wafer that the wafer container is configured to accommodate.

9 Claims, 3 Drawing Sheets

WAFER CONTAINER AND PURGE SYSTEM

FIELD

This disclosure is directed to wafer containers including purge diffusers for purging moist air from the wager container, particularly purging moist air from areas corresponding to lower slots of the wager container.

BACKGROUND

Wafer containers are used during the storage and processing of wafers such as semiconductor wafers. During some process steps, undesirable gases such as moist air can be present in the wafer containers. The undesirable gases can be purged by introduction of a purge gas into the wafer container. However, the constrained structure of wafer containers and the required standard features of such containers can limit purge performance in such wafer containers.

SUMMARY

This disclosure is directed to wafer containers including purge diffusers for purging moist air from the wager container, particularly purging moist air from areas corresponding to lower slots of the wager container.

In wafer containers according to embodiments, diffusers are offset from their respective purge ports towards a center line of the container. This places the diffusers closer to one another along the back wall in positions corresponding to a center panel of the back wall. This also reduces the angle between the diffusers with respect to one another about a center of a wafer when the wafer is stored within the wafer container, and the angle between each diffuser with respect to an center line of the wafer container. The positioning of the diffusers with respect to the features of the container and the wafers results in improved distribution of purge gas that can more effectively purge the lower slots of the wafer container.

In an embodiment, a wafer container includes a top wall, a bottom wall, a first side wall, a second side wall, and a back wall. The top wall, the bottom wall, the first side wall, the second side wall, and the back wall define an interior space. The interior space is configured to accommodate one or more wafers. The wafer container further includes a first diffuser located within the interior space and a second diffuser located within the interior space. An angle between the first diffuser and the second diffuser relative to a central axis of the one or more wafers when the one or more wafers are accommodated within the interior space is 60 degrees or less, wherein the central axis extends perpendicular to a plane of the one or more wafers through a center of each of the one or more wafers.

In an embodiment, the first diffuser is located on a first side of a center line of the interior space, the center line being evenly spaced between the first side wall and the second side wall, and the second diffuser is located on a second side of the center line of the interior space, the center line extending perpendicular to an opening of the wafer container and intersecting the central axis of the one or more wafers.

In an embodiment, an angle between the center line and the first diffuser relative to the central axis is 30 degrees or less and an angle between the center line and the second diffuser relative to the central axis is 30 degrees or less.

In an embodiment, a wafer container includes a top wall, a bottom wall, a first side wall, a second side wall, and a back wall. The top wall, the bottom wall, the first side wall, the second side wall, and the back wall define an interior space. The interior space has a center line evenly spaced between the first side wall and the second side wall, the center line perpendicular to the back wall. The wafer container further includes a first diffuser located within the interior space on a first side of the center line and a second diffuser located within the interior space on a second side of the center line. The wafer container is configured to accommodate one or more wafers having a predetermined diameter. The first diffuser is spaced apart from the center line by a distance that is less than one fourth of the predetermined diameter and the second diffuser is spaced apart from the center line by a distance that is less than one fourth of the predetermined diameter.

In an embodiment, a wafer container includes a top wall, a bottom wall, a first side wall, a second side wall, and a back wall. The top wall, the bottom wall, the first side wall, the second side wall, and the back wall define an interior space. The back wall includes a central panel, the central panel recessed relative to an exterior of the wafer container. The wafer container further includes a first diffuser located within the interior space and a second diffuser located within the interior space. The first diffuser is spaced apart from the second diffuser in a direction parallel to the plane of the back wall by a distance less than a width of the central panel of the back wall.

In an embodiment, a wafer container includes a top wall, a bottom wall, a first side wall, a second side wall and a back wall. The top wall, the bottom wall, the first side wall, the second side wall, and the back wall define an interior space. The interior space has a center line evenly spaced between the first side wall and the second side wall, the center line perpendicular to the back wall. The wafer container further includes a first purge port formed in the bottom wall and a first diffuser located within the interior space on a first side of the center line, the first diffuser connected to the first purge port. The wafer container also includes a second purge port formed in the bottom wall and a second diffuser located within the interior space on a second side of the center line, the second diffuser connected to the second purge port. The first diffuser is spaced apart from the center line by a distance that is less than a distance from the center line to the first purge port, and the second diffuser is spaced apart from the center line by a distance that is less than a distance from the center line to the second purge port.

DRAWINGS

DETAILED DESCRIPTION

This disclosure is directed to wafer containers including purge diffusers for purging moist air from the wager container, particularly purging moist air from areas corresponding to lower slots of the wager container.

Figure 1A:
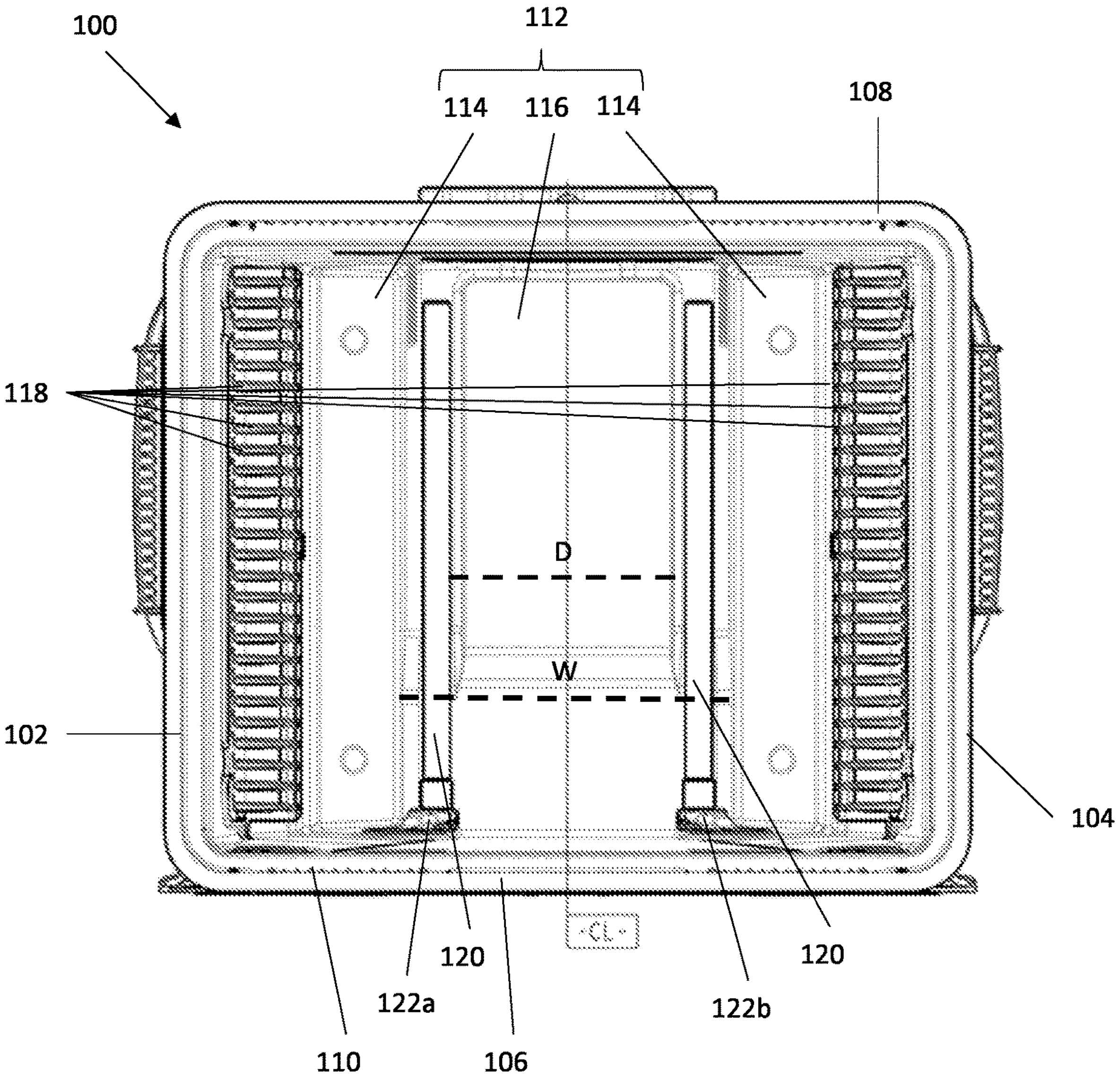
FIG. 1A shows a front view of a wafer container according to an embodiment.

FIG. 1A shows a front view of a wafer container according to an embodiment. Wafer container 100 includes first side wall 102, second side wall 104, bottom wall 106 and second side 108. The first side wall 102, second side wall 104, bottom wall 106, and top wall 108 define a front opening 110 of the wafer container 100. A back wall 112 encloses a back end to form an interior space of the wafer container 100. The back wall includes protruding corner portions 114 where back wall 112 meets first side wall 102 and second side wall 104, and a recessed central panel 116 at a center of the back wall 112 between the protruding corner portions 114. The first side wall 102 and the second side wall 104 each include flanges 118 protruding into the interior space, defining wafer slots each configured to support a wafer. The wafer container 100 includes diffusers 120, with the diffusers 120 each mounted on one of first or second offset connectors 122*a* and 122*b*.

Wafer container 100 is a container configured to accommodate one or more wafers. Wafer container 100 can be, for example, a front-opening unified pod (FOUP). The size of wafer container 100 can be based on a predetermined size of wafers to be stored within the wafer container 100. The predetermined size can be any suitable size for a wafer. Non-limiting examples of wafer sizes for which wafer container 100 can be configured to accommodate include 450 mm wafers or 300 mm wafers. In an embodiment, wafer container 100 is configured to accommodate 300 mm wafers.

First side wall 102, second side wall 104, bottom wall 106, top wall 108, and back wall 112 define wafer container 100 including an interior space. Front opening 110 can be sized to allow wafers to be inserted into or removed from wafer container 100. In an embodiment, a door (not shown) can be provided to enclose front opening 110. In an embodiment, front opening 110 can allow fluid to exit wafer container 100, for example during a purge operation. Wafers placed into the interior space can each be placed into wafer slots, supported by flanges 118 provided on the first and second side walls 102 and 104.

The back wall 112 can include protruding corner portions 114. The protruding corner portions 114 can be positioned at outer portions of back wall 112, where back wall 112 respectively meets first side wall 102 or second side wall 104. The protruding corner portions 114 can project outwards with respect to the interior space, i.e. away from the viewer in the front view of FIG. 1A. A central panel 116 can be positioned between the protruding corner portions 114. The central panel 116 can cross over a center line CL of the wafer container 100. The central panel can be recessed into the interior space with respect to the protruding corner portions 114, i.e. spaced towards the viewer in the front view of FIG. 1A. The center line CL is a line evenly spaced between first side wall 102 and second side wall 104. The central panel 116 of back wall 112 can have a center line that is collinear with the center line CL of the wafer container 100.

Diffusers 120 are diffusers configured to distribute a purge gas within the interior space of wafer container 100. The diffusers 120 can be any suitable diffusers for distributing the purge gas. In an embodiment, the diffusers 120 are tubes made of porous material. In an embodiment, the diffusers 120 are diffuser towers. The diffusers 120 are each connected to one of first offset connector 122*a* or second offset connectors 122*b*. The offset connectors 122*a,b* provide a connection between the diffusers 120 and rear purge ports (not shown; visible in FIG. 2 and described below) that are configured to receive a supply of purge gas. The offset connectors 122*a,b* provide an offset between the center of the purge port and the center of the diffuser 120 connected to that purge port. In an embodiment, the offset provided by offset connectors 122*a,b* is such that the diffusers 120 are closer to the center line CL of wafer container 100 than the purge ports are.

In an embodiment, the position of the diffusers 120 can be understood with reference to the central panel 116 of back wall 112. In an embodiment, the diffusers 120 are positioned such that the diffusers 120 are within the perimeter of central panel 116 when viewed in a front view such as the front view of FIG. 1A. A distance D between the diffusers 120 can be less than a width W of the central panel 116.

Figure 1B:
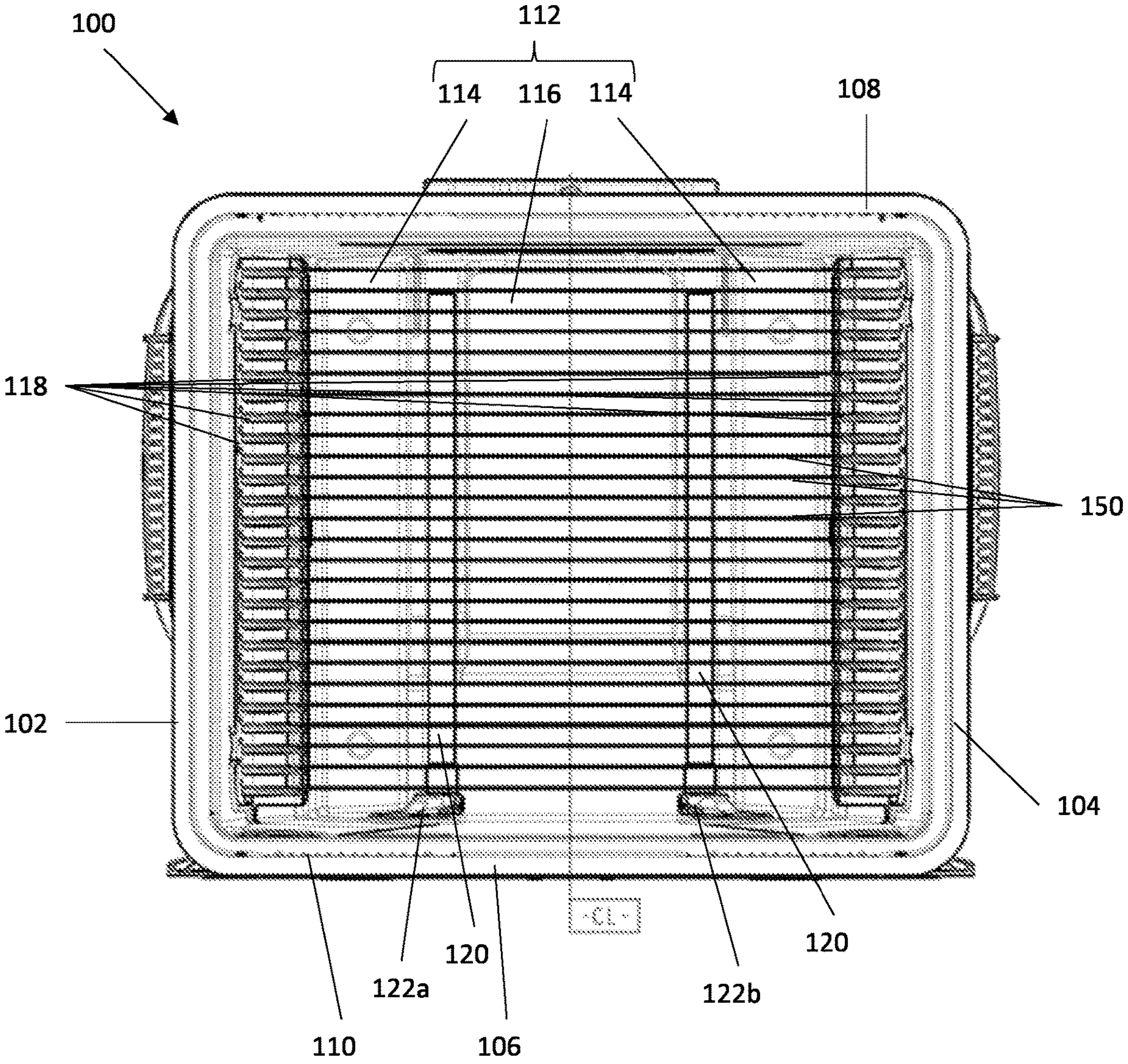
FIG. 1B shows a front view of the wafer container of FIG. 1A when wafers are added to the wafer container.
Figure 2:
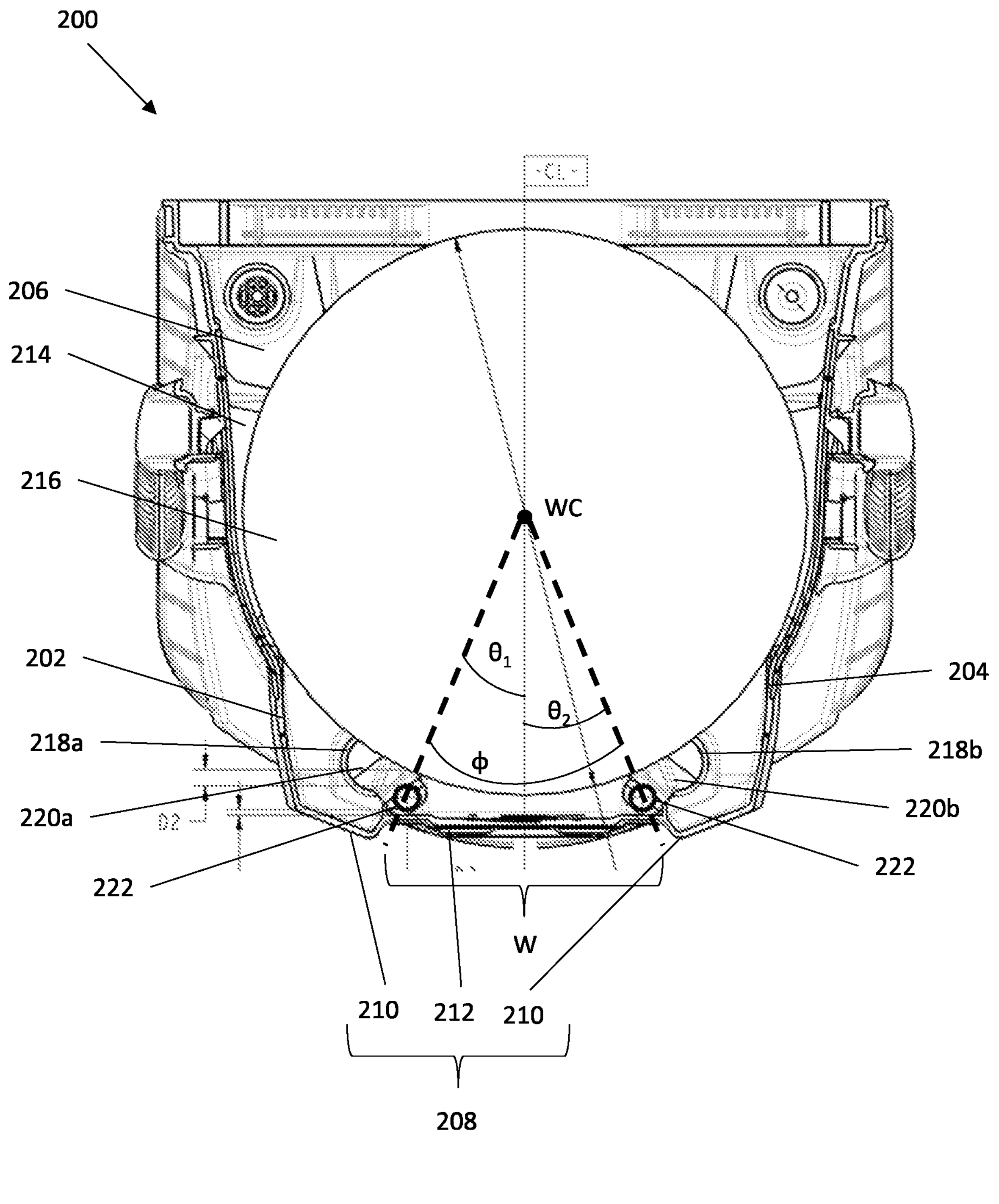
FIG. 2 shows a sectional view of a wafer container according to an embodiment.

FIG. 1B shows a front view of the wafer container of FIG. 1A when wafers are added to the wafer container. Wafers 150 are loaded into wafer container 100 through the front opening 110, such that they each rest on the flanges 118 defining the wafer slots. In an embodiment, when wafers 150 are positioned in the wafer slots, a central axis extending vertically through a center of each of the wafers can be defined. The central axis can be in plane with the center line CL of wager container 100. In an embodiment, the position of the diffusers 120 can be defined by their respective angles formed about the central axis, as shown in FIG. 2 and described below. In an embodiment, the position of diffusers 120 can be such that they are spaced apart by a distance based on the diameter of the wafers 150 that wafer container 100 is configured to accommodate. The distance between the diffusers 120 can be, for example, one fourth or less of the diameter of the wafers 150 that wafer container 100 is configured to accommodate. The wafers 150 can be, for example, 300 mm wafers. In an embodiment, the diffusers can be evenly distributed on either side of the center line CL, such that a distance from the center line CL to each diffuser 120 is the same and the diffusers 120 are on opposing sides of the center line CL.

FIG. 2 shows a sectional view of a wafer container according to an embodiment. In the sectional view of FIG. 2, the viewer is looking at wafer container 200 from a top view. Wafer container 200 includes first side wall 202, second side wall 204, and bottom wall 206. Wafer container 200 also includes a back wall 208 including protruding corner sections 210 and recessed central panel 212. Wafer container 200 further includes a top wall (not shown) above where the section is taken in the view of FIG. 2. Wafer container 200 includes flanges 214 extending from first side wall 202 and second side wall 204 to provide slots configured to support wafers 216. Wafer container 200 includes first and second rear purge ports 218*a* and 218*b*, first and second offset connectors 220*a* and 220*b*, and diffusers 222.

Wafer container 200 is a container sized to accommodate wafers. Wafer container 200 can be, for example, a front-opening unified pod (FOUP). The size of wafer container 200 can be based on a predetermined size of wafers 216 to be stored within the wafer container 200. The predetermined size can be any suitable size for a wafer. Non-limiting examples of wafer sizes for which wafer container 200 can be configured to accommodate include 450 mm wafers or 300 mm wafers. In an embodiment, wafer container 200 is configured to accommodate 300 mm wafers.

First side wall 202, second side wall 204, bottom wall 206, back wall 208, and the top wall are connected to one another to define an interior space of wafer container 200 having an open front side. A center line CL of wafer container 200 is a line evenly spaced between the first side wall 202 and the second side wall 204. The center line CL can be consistent through a height of wafer container 200, providing a plane perpendicular to bottom wall 206. First side wall 202 and second side wall 204 each include flanges

214 extending inwards into the interior space. The flanges 214 form slots to support wagers placed into wafer container 200.

Back wall 208 forms a back of the wafer container 200. Back wall 208 includes protruding corner sections 210 where back wall 208 bulges outwards from where back wall 208 meets first and second side walls 202, 204. Central panel 212 of back wall 208 is relatively recessed compared to protruding corner sections 210 of back wall 208. The central panel 212 can extend across the center line CL of the wafer container.

First and second rear purge ports 218*a,b* are ports through the bottom wall 206 of the wafer container 200. The first and second rear purge ports 218*a,b* are configured to allow the introduction of purge gas into the interior space of wafer container 200. First rear purge port 218*a* can be located on a first side of the center line CL. Second rear purge port 218*b* can be located on a second side of the center line CL, opposite the first side where first rear purge port 218*a* is located. In an embodiment, a distance between the first rear purge port 218*a* and the center line CL and a distance between the center line CL and the second rear purge port 218*b* are equal. In an embodiment, the first rear purge port 218*a* and the second rear purge port 218*b* are each located such that a center of the respective purge port 218*a, b* is further from the center line CL than the end of the central panel 212 on the respective side of the center line CL.

First and second offset connectors 220*a,b* are connectors configured to direct purge gas from the respective first and second rear purge ports 218*a,b*. First and second offset connectors 220*a,b* each include an offset such that a center of the connected diffuser is not collinear with a center of the corresponding purge port 218*a,b*. In an embodiment, the offset provided by the first and second offset connectors 220*a,b* are such that each of diffusers 222 are located closer to the center line than the respective purge ports 218*a,b*. In an embodiment, the central axis of each of diffusers 222 is closer to the center line than a central axis of the respective purge ports 218*a,b*. In an embodiment, the outermost edge of each of diffusers 222 relative to the center line is closer to the center line than the corresponding outermost edge of the respective purge ports 218*a,b*. The diffusers 222 are each configured to receive the purge gas from one of the offset connectors 220*a,b* and provide the purge gas to the interior space of the wafer container 200. The diffusers 222 can be any suitable structure for providing the purge gas to the interior space. In an embodiment, diffusers 222 are tubes made of porous material. The diffusers 222 can be diffuser towers.

In an embodiment, the position of the diffusers 222 can be defined with respect to an angle with respect to a central axis of the wafers 216. The central axis of wafers 216 can be a line extending through a center WC of each of the wafers 216. The central axis extends in a vertical direction of wafer container 200 from bottom wall 206 to the top wall. In an embodiment, the angle formed by the positions of the two diffusers with respect to the central axis of the wafers $\phi$ is 60 degrees or less. In an embodiment, $\phi$ can be 52 degrees or less. In an embodiment, $\phi$ can be 44 degrees or less. In an embodiment, $\phi$ can be between 30 degrees and 60 degrees. In an embodiment, $\phi$ can be between 38 degrees and 52 degrees. In an embodiment, an angle between the diffuser 222 connected to first offset connector 220*a* and center line CL $\theta_1$ is 30 degrees or less. In an embodiment, an angle between center line CL and the diffuser 222 connected to second offset connector 220*b* $\theta_2$ is 30 degrees or less. In an embodiment, $\theta_1$ is equal to $\theta_2$. In an embodiment, one or both of $\theta_1$ and $\theta_2$ can each be 26 degrees or less. In an embodiment, one or both of $\theta_1$ and $\theta_2$ can each be 26 degrees or less. In an embodiment, one or both of $\theta_1$ and $\theta_2$ can each be between 15 degrees and 30 degrees. In an embodiment, one or both of $\theta_1$ and $\theta_2$ can each be between 19 degrees and 26 degrees.

In an embodiment, the position of the diffusers 222 can be defined with respect to a distance from the center line CL. In an embodiment, the distance between each of the diffusers 222 and center line CL can be based on the predetermined size of wafers 216 that wafer container 200 is configured to accommodate. The distance between each of the diffusers 222 and the center line CL can be, for example, less than one fourth of the diameter of the wafers that wafer container 200 is configured to accommodate. For example, when wafer container 200 is configured to accommodate 300 mm wafers, a maximum distance between any of the diffusers and the center line CL can be 75 mm or less.

In an embodiment, the position of the diffusers 222 can correspond to the central panel 212 of back wall 208. The diffusers 222 can be spaced apart by a distance that is less than a width W of the central panel 212. In an embodiment, the diffusers 222 can be positioned such that distance from each of the diffusers 222 to the center line CL is less than a distance from the center line CL to an end of the central panel 212 where said central panel 212 meets one of the protruding corner portions 210 on the same side of the center line CL.

Aspects

It is understood that any of aspects 1-3 can be combined with any of aspects 4, 5, and/or 6. It is understood that aspect 4 can be combined with any of aspects 5 and/or 6. It is understood that aspect 5 can be combined aspect 6.

Aspect 1. A wafer container, comprising:

a top wall;

a bottom wall;

a first side wall;

a second side wall;

a back wall, wherein the top wall, the bottom wall, the first side wall, the second side wall, and the back wall define an interior space, the interior space configured to accommodate one or more wafers;

a first diffuser located within the interior space; and a second diffuser located within the interior space, wherein an angle between the first diffuser and the second diffuser relative to a central axis of the one or more wafers when the one or more wafers are accommodated within the interior space is 60 degrees or less, wherein the central axis extends perpendicular to a plane of the one or more wafers through a center of each of the one or more wafers.

Aspect 2. The wafer container according to aspect 1, wherein the first diffuser is located on a first side of a center line of the interior space, the center line being evenly spaced between the first side wall and the second side wall, and the second diffuser is located on a second side of the center line of the interior space, the center line extending perpendicular to an opening of the wafer container and intersecting the central axis of the one or more wafers.

Aspect 3. The wafer container according to aspect 2, wherein an angle between the center line and the first diffuser relative to the central axis is 30 degrees or less and an angle between the center line and the second diffuser relative to the central axis is 30 degrees or less.

Aspect 4. A wafer container, comprising:

a top wall;

a bottom wall;

a first side wall;

a second side wall;

a back wall, wherein the top wall, the bottom wall, the first side wall, the second side wall, and the back wall define an interior space, the interior space having a center line evenly spaced between the first side wall and the second side wall, the center line perpendicular to the back wall;

a first diffuser located within the interior space on a first side of the center line; and a second diffuser located within the interior space on a second side of the center line, wherein the wafer container is configured to accommodate one or more wafers having a predetermined diameter, the first diffuser is spaced apart from the center line by a distance that is less than one fourth of the predetermined diameter, and the second diffuser is spaced apart from the center line by a distance that is less than one fourth of the predetermined diameter.

Aspect 5. A wafer container, comprising:

a top wall;

a bottom wall;

a first side wall;

a second side wall;

a back wall, wherein the top wall, the bottom wall, the first side wall, the second side wall, and the back wall define an interior space, the back wall including a central panel, the central panel recessed relative to an exterior of the wafer container;

a first diffuser located within the interior space; and a second diffuser located within the interior space, wherein the first diffuser is spaced apart from the second diffuser in a direction parallel to the plane of the back wall by a distance less than a width of the central panel of the back wall.

Aspect 6. A wafer container, comprising:

a top wall;

a bottom wall;

a first side wall;

a second side wall;

a back wall, wherein the top wall, the bottom wall, the first side wall, the second side wall, and the back wall define an interior space, the interior space having a center line evenly spaced between the first side wall and the second side wall, the center line perpendicular to the back wall;

a first purge port formed in the bottom wall;

a first diffuser located within the interior space on a first side of the center line, the first diffuser connected to the first purge port;

a second purge port formed in the bottom wall; and a second diffuser located within the interior space on a second side of the center line, the second diffuser connected to the second purge port wherein the first diffuser is spaced apart from the center line by a distance that is less than a distance from the center line to the first purge port, and the second diffuser is spaced apart from the center line by a distance that is less than a distance from the center line to the second purge port.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A wafer container, comprising:

a top wall;

a bottom wall;

a first side wall;

a second side wall;

a back wall comprising a central panel, the back wall comprising protruding corner portions, the central panel being positioned between the protruding corner portions and recessed relative to an exterior of the wafer container, wherein the top wall, the bottom wall, the first side wall, the second side wall, and the back wall define an interior space, the interior space configured to accommodate one or more wafers;

a first diffuser located within the interior space; and a second diffuser located within the interior space, wherein an angle between the first diffuser and the second diffuser relative to a central axis of the one or more wafers when the one or more wafers are accommodated within the interior space is 60 degrees or less, wherein the central axis extends perpendicular to a plane of the one or more wafers through a center of each of the one or more wafers, and wherein the first diffuser is spaced apart from the second diffuser in a direction parallel to the plane of the back wall by a distance less than a width of the central panel, and wherein, in a front view of the wafer container, the first diffuser and the second diffuser are positioned within a perimeter of the central panel.

2. The wafer container of claim 1, wherein the first diffuser is located on a first side of a center line of the interior space, the center line being evenly spaced between the first side wall and the second side wall, and the second diffuser is located on a second side of the center line of the interior space, the center line extending perpendicular to an opening of the wafer container and intersecting the central axis of the one or more wafers.

3. The wafer container of claim 2, wherein an angle between the center line and the first diffuser relative to the central axis is 30 degrees or less and an angle between the center line and the second diffuser relative to the central axis is 30 degrees or less.

4. The wafer container of claim 1, further comprising a first offset between the first diffuser and a first purge port and a second offset between the second diffuser and a second purge port.

5. The wafer container of claim 1, wherein the first diffuser comprises a diffuser tower.

6. The wafer container of claim 1, wherein the first diffuser is spaced apart from the center line by a distance that is less than a distance from the center line to the first purge port, and the second diffuser is spaced apart from the center line by a distance that is less than a distance from the center line to the second purge port.

7. A wafer container, comprising:

a top wall;

a bottom wall;

a first side wall;

a second side wall;

a back wall comprising a central panel, the back wall comprising protruding corner portions, the central panel being positioned between the protruding corner portions and recessed relative to an exterior of the wafer container, wherein the top wall, the bottom wall, the first side wall, the second side wall, and the back wall define an interior space, the interior space having a center line evenly spaced between the first side wall and the second side wall, the center line perpendicular to the back wall;

a first diffuser located within the interior space on a first side of the center line; and a second diffuser located within the interior space on a second side of the center line, wherein the wafer container is configured to accommodate one or more wafers having a predetermined diameter, wherein, in a front view of the wafer container, the first diffuser and the second diffuser are positioned within a perimeter of the central panel, wherein the first diffuser is spaced apart from the second diffuser in a direction parallel to the plane of the back wall by a distance less than a width of the central panel, the first diffuser is spaced apart from the center line by a distance that is less than one fourth of the predetermined diameter, and the second diffuser is spaced apart from the center line by a distance that is less than one fourth of the predetermined diameter.

8. The wafer container of claim 7, wherein the first diffuser and second diffuser are symmetrical with respect to the center line.

9. The wafer container of claim 7, wherein an angle between the centerline and a line between the first diffuser and a center of a wafer storage location is about 30 degrees.

* * * * *